(12) United States Patent
Kian et al.

(10) Patent No.: US 6,762,124 B2
(45) Date of Patent: Jul. 13, 2004

(54) METHOD FOR PATTERNING A MULTILAYERED CONDUCTOR/SUBSTRATE STRUCTURE

(75) Inventors: Kouroche Kian, Altadena, CA (US); Ramin Heydarpour, Beverly Hills, CA (US)

(73) Assignee: Avery Dennison Corporation, Pasadena, CA (US)

( * ) Notice: Subject to any disclaimer, the term of this patent is extended or adjusted under 35 U.S.C. 154(b) by 261 days.

(21) Appl. No.: 09/783,122

(22) Filed: Feb. 14, 2001

(65) Prior Publication Data

US 2002/0110944 A1 Aug. 15, 2002

(51) Int. Cl.$^7$ .............................................. H01L 21/461
(52) U.S. Cl. ...................... 438/690; 438/706; 438/707; 438/714; 438/717
(58) Field of Search ............................... 438/706, 707, 438/714, 717, 720, 725, 360

(56) References Cited

U.S. PATENT DOCUMENTS

| | | | |
|---|---|---|---|
| 4,093,345 A | * | 6/1978 | Logan et al. .................. 385/2 |
| 4,166,876 A | | 9/1979 | Chiba et al. ................ 428/215 |
| 4,234,654 A | | 11/1980 | Yatabe et al. ............... 428/333 |
| 4,458,994 A | | 7/1984 | Jain et al. ...................... 354/4 |
| 4,640,583 A | | 2/1987 | Hoshikawa et al. |
| 4,734,174 A | | 3/1988 | Venis, Jr. ................. 204/129.5 |
| 4,752,455 A | * | 6/1988 | Mayer ........................ 427/597 |
| 4,773,750 A | | 9/1988 | Bruning ...................... 353/122 |
| 4,854,675 A | | 8/1989 | Yamazaki et al. |
| 4,927,493 A | | 5/1990 | Yamazaki et al. .......... 156/643 |
| 4,970,366 A | | 11/1990 | Imatou et al. ......... 219/121.68 |
| 5,034,795 A | | 7/1991 | Henry ......................... 357/30 |
| 5,062,916 A | | 11/1991 | Aufderheide et al. ....... 156/269 |

(List continued on next page.)

FOREIGN PATENT DOCUMENTS

| | | |
|---|---|---|
| EP | 0699375 B1 | 3/1996 |
| EP | 0733931 A2 | 9/1996 |
| JP | 02037326 A | 2/1990 |
| JP | 09171188 A | 6/1997 |
| JP | 096152618 A | 6/1997 |
| WO | WO95/22881 | 8/1995 |
| WO | WO99/36261 | 7/1999 |
| WO | WO99/42860 | 8/1999 |
| WO | WO99/51386 | 10/1999 |

OTHER PUBLICATIONS

D. Constantinide, "Scanning Projection Lithography for Large Area Substrates," http://www.tamsci.com/techpadidx.htm (downloaded Jan. 23, 2001).

(List continued on next page.)

*Primary Examiner*—Robert Kunemund
*Assistant Examiner*—Binh X. Tran
(74) *Attorney, Agent, or Firm*—Henricks, Slavin & Holmes LLP

(57) ABSTRACT

A method for patterning a multilayered conductor/substrate structure includes the steps of: providing a multilayered conductor/substrate structure which includes a plastic substrate and at least one conductive layer overlying the plastic substrate; and irradiating the multilayered conductor/substrate structure with ultraviolet radiation such that portions of the at least one conductive layer are ablated therefrom. In a preferred embodiment, a projection-type excimer laser system is employed to rapidly and precisely ablate a pattern from a mask into the at least one conductive layer. Preferably, the excimer laser is controlled in consideration of how well the at least one conductive layer absorbs radiation at particular wavelengths. Preferably, a fluence of the excimer laser is controlled in consideration of an ablation threshold level of at least one conductive layer. According to a preferred method, the excimer laser is employed and controlled to ablate portions of the at least one conductive layer without completely decomposing the at least one functional layer therebeneath.

37 Claims, 11 Drawing Sheets

U.S. PATENT DOCUMENTS

| | | | |
|---|---|---|---|
| 5,298,351 A | 3/1994 | Bobroff et al. | |
| 5,311,533 A | 5/1994 | Stutius et al. | 372/46 |
| 5,320,918 A | 6/1994 | Raab et al. | 430/4 |
| 5,322,876 A | 6/1994 | Sasaki et al. | 524/366 |
| 5,512,148 A | 4/1996 | Smith, Jr. et al. | 204/192.23 |
| 5,514,618 A | 5/1996 | Hunter, Jr. et al. | 437/60 |
| 5,530,516 A | 6/1996 | Sheets | 355/53 |
| 5,609,778 A | 3/1997 | Pulaski et al. | |
| 5,625,477 A | 4/1997 | Wu et al. | 349/35 |
| 5,661,533 A | 8/1997 | Wu et al. | 349/169 |
| 5,667,853 A | 9/1997 | Fukuyoshi et al. | 428/1 |
| 5,702,565 A | 12/1997 | Wu et al. | 156/643.1 |
| 5,703,436 A | 12/1997 | Forrest et al. | 313/506 |
| 5,705,551 A | 1/1998 | Sasaki et al. | 524/366 |
| 5,714,404 A | 2/1998 | Mitlitsky et al. | 437/233 |
| RE35,753 E | 3/1998 | Raab et al. | 430/4 |
| 5,724,175 A * | 3/1998 | Hichwa et al. | 359/265 |
| 5,726,524 A | 3/1998 | Debe | 313/309 |
| 5,744,664 A | 4/1998 | Brekner et al. | |
| 5,796,454 A | 8/1998 | Ma | 349/98 |
| 5,817,550 A | 10/1998 | Carey et al. | 438/166 |
| 5,825,451 A | 10/1998 | Ma et al. | 349/187 |
| 5,856,858 A | 1/1999 | Carey et al. | 349/158 |
| 5,889,566 A | 3/1999 | Wu et al. | 349/35 |
| 5,933,203 A | 8/1999 | Wu et al. | 349/35 |
| 5,949,513 A | 9/1999 | Ma et al. | 349/187 |
| 5,969,803 A | 10/1999 | Mercado | 355/67 |
| 5,986,824 A | 11/1999 | Mercado | 359/754 |
| 5,990,926 A | 11/1999 | Mercado | 347/258 |
| 6,020,941 A | 2/2000 | Ma | 349/15 |
| 6,025,110 A * | 2/2000 | Nowak | 430/200 |
| 6,067,311 A * | 5/2000 | Morton et al. | 372/57 |
| 6,083,313 A | 7/2000 | Venkatraman et al. | |
| 6,103,992 A | 8/2000 | Noddin | |
| 6,124,918 A | 9/2000 | Park et al. | |
| 6,159,659 A | 12/2000 | Gelbart | |
| 6,177,151 B1 * | 1/2001 | Chrisey et al. | 427/596 |
| 6,285,001 B1 * | 9/2001 | Fleming et al. | 219/121.72 |
| 6,300,594 B1 * | 10/2001 | Kinoshita et al. | 219/121.69 |
| 6,433,301 B1 * | 8/2002 | Dunsky et al. | 219/121.67 |
| 6,492,026 B1 * | 12/2002 | Graff et al. | 428/411.1 |
| 6,602,790 B2 * | 8/2003 | Kian et al. | 438/690 |

OTHER PUBLICATIONS

S. Zhou and M. Kilgo, "Material Removal Rates of Biocompatilbe Polymers During Laser Ablation," http://www.tamsci.com/techpadidx.htm (downloaded Jan. 23, 2001).

Tamarack Scientific Co., Inc., "Excimer Laser Ablation Systems," brochure, published Oct. 2000.

Resonetics, Inc., "Laser Micromachining in Contract Manufacturing," http://www.resonetics.com/contractMFG.htm (downloaded Oct. 26, 2000).

Tamarack Scientific Co., Inc., "Excimer Laser Photoablation Systems," http://www.tamsci.com/ablation.htm (downloaded Oct. 31, 2000).

P.Y.Z. Chu et al., "42.2: A New Conductor Structure for Plastic LCD Applications Utilizing 'All Dry' Digital Laser Patterning," *1998 SID International Symposium Digest of Technical Papers, Anaheim, CA*, May 17–22, 1998, vol. 29, No. 1, May 17, 1998, pp. 1099–1101.

A. Heller, "Flat–Panel Displays Slim Down with Plastic," *Science and Technology Review*, Nov., 1999.

Tamarack Scientific Co., Inc., "Large area scanning projection exposure systems," brochure, published Oct. 2000.

R.E. Sheets, "Scanning projection for large–area lithography," *Microlithography World*, Spring 1996.

D.E. Rector and M.H. Boothman, "Modern Manufacture of Large Area Photomasks," *1997 Display Manufacturing Technology Conference Digest of Technical Papers* SID, p. 39–40 (1997).

F.E. Doany et al., "Large–field scanning laser ablation system," *IBM Journal of Research and Development*, vol. 41, No. 1/2, 1997.

R.E. Sheets and H.G. Muller, "Scanning Projection Tools for Large Area Thin Film Displays," *1994 Display Manufacturing Technology Conference Digest of Technical Papers*, SID, p. 97–98 (1994).

C.W. Laasko and W.A. Barrow, "Use of a Scanning Projection Exposure Tool in Fabrication of Full Color TFEL Displays," *1995 Display Manufacturing Technology Conference Digest of Technical Papers*, SID, p. 101–102 (1995).

H. Endert and U. Leinhos, "Excimer Lasers: A New, Powerful Tool for Microstructuring," *LIGA news Third Issue*, Sep. 1995.

* cited by examiner

Film #2/183 mJ/cm2
mcr4297.006

X 10.000 μm/div
Z 300.000 nm/div

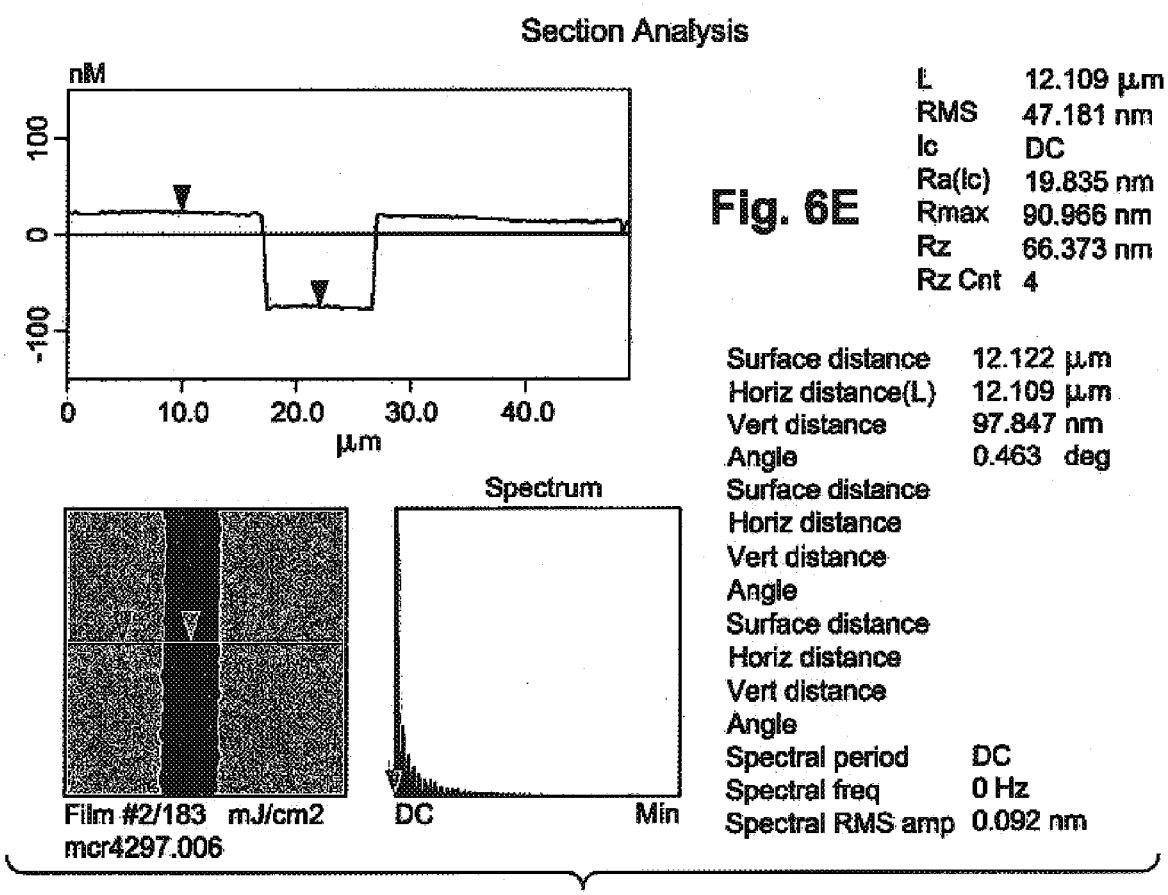

METHOD FOR PATTERNING A MULTILAYERED CONDUCTOR/SUBSTRATE STRUCTURE

CROSS-REFERENCE TO RELATED APPLICATION

This application is related to application Ser. No. 09/783,105 entitled "Multilayered Electrode/Substrate Structures And Display Devices Incorporating The Same", filed herewith on Feb. 14. 2001. This patent application is assigned to the same assignee as the related application, said related application being incorporated herein by reference.

BACKGROUND OF THE INVENTION

1. Field of Invention

The present invention relates generally to laser ablation of conductive films and, more specifically, to a method for laser patterning a multilayered conductor/plastic substrate structure and to multilayered electrode/plastic substrate structures and display devices incorporating the same.

2. Description of the Related Art

A liquid crystal display (LCD) is a type of flat panel display used in various electronic devices. Generally, LCDs comprise two sheets of polarizing material with a liquid crystal solution therebetween. Each sheet of polarizing material typically comprises a substrate of glass or transparent plastic; the liquid crystal (LC) is used as optical switches. The substrates are usually manufactured with transparent electrodes, typically made of indium tin oxide (ITO), to which electrical "driving" signals are coupled. The driving signals induce an electric field which can cause a phase change or state change in the LC material; the LC exhibiting different light-reflecting characteristics according to its phase and/or state.

Liquid crystals may be nematic, smectic or cholesteric depending upon the arrangement of the molecules. A twisted nematic cell is made up of: two bounding plates (usually glass slides), each with a transparent conductive coating (such as ITO) that acts as an electrode, spacers to control the cell gap, two crossed polarizers (the polarizer and the analyzer), and nematic liquid crystal material. Twisted nematic displays rotate the director of the liquid crystal by 90°. Super-twisted nematic displays employ up to a 270° rotation. This extra rotation gives the crystal a much steeper voltage-brightness response curve and also widens the angle at which the display can be viewed before losing much contrast. Cholesteric liquid crystal (CLC) displays are normally reflective (meaning no backlight is needed) and can function without the use of polarizing films or a color filter. "Cholesteric" means a type of liquid crystal having finer pitch than that of twisted nematic and super twisted nematic. Sometimes it is called "chiral nematic" because cholesteric liquid crystal is normally obtained by adding chiral agents to host nematic liquid crystals. Cholesteric liquid crystals may be used to provide bi-stable and multi-stable displays that, due to their non-volatile "memory" characteristic, do not require a continuous driving circuit to maintain a display image, thereby significantly reducing power consumption. Ferroelectric liquid crystals (FLCs) use liquid crystal substances that have chiral molecules in a smectic C type of arrangement because the spiral nature of these molecules allows the microsecond switching response time that make FLCs particularly suited to advanced displays. Surface-stabilized ferroelectric liquid crystals (SSFLCs) apply controlled pressure through the use of a glass plate, suppressing the spiral of the molecules to make the switching even more rapid.

Some known LCD devices include chemically-etched, transparent, conductive layers overlying a glass substrate. See, e.g., U.S. Pat. No. 5,667,853 to Fukuyoshi et al., incorporated herein by reference. Unfortunately, chemical etching processes are often difficult to control especially for plastic films. As a consequence, electrodes resulting from such processes are often misshaped, with "wells" being formed near the substrate in instances where too much etchant was employed. Moreover, the minimum line gaps obtained in plastic films are typically limited to 15 $\mu$m or more. Additionally, concerns for the environment lessen the desirability of employing chemical etching processes which produce dangerous and/or harmful byproducts.

There are alternative display technologies to LCD's that may be used for example in flat panel displays. A notable example is organic light emitting devices (OLEDs), which are comprised of several layers in which one of the layers is comprised of an organic material that can be made to electroluminesce by applying a voltage across the device. An OLED device is typically a laminate formed on a substrate such as glass. A light-emitting layer of a luminescent organic solid, as well as adjacent semiconductor layers, are sandwiched between an anode and a cathode. The semiconductor layers may be hole-injecting and electron-injecting layers. The light-emitting layers may be selected from any of a multitude of light emitting organic solids, e.g. polymers. When a potential difference is applied across the cathode and anode, electrons from the electrode-injecting layer and holes from the hole-injecting layer are injected into the light-emitting layer. They recombine, emitting light.

In a typical matrix-addressed light-emitting display device, numerous light emitting devices are formed on a single substrate and arranged in groups in a regular grid pattern. Activation may be by rows and columns, or in an active matrix with individual cathode and anode pads. OLED's are often manufactured by first depositing a transparent electrode on the substrate, and patterning the same into electrode portions. The organic layer(s) is then deposited over the transparent electrodes. A metallic electrode may be formed over the electrode layers. For example, in U.S. Pat. No. 5,703,436 to Forrest et al., incorporated herein by reference, transparent indium tin oxide (ITO) is used as the hole-injecting electrode, and a Mg-Ag-ITO electrode layer is used for electron injection.

An excimer laser has been employed to pattern ITO electrode material overlying a glass or quartz substrate. See, e.g., U.S. Pat. No. 4,970,366 to Imatou et al. and European Patent Specification EP 0 699 375 B1 by Philips Electronics N.V., both incorporated herein by reference. However, electrode/substrate structures formed with glass or quartz substrates lack the flexibility and thickness desired for many display products.

F. E. Doany et al., "Large-field scanning laser ablation system", IBM Journal of Research and Development, Vol. 41, No. ½, 1997, incorporated herein by reference, discloses a large-field scanning laser ablation system which employs a XeCl 308 nm excimer laser and a mask for ablating vias (down to 8 $\mu$m) in a polyimide layer. The system employs a projection lens (Dyson-type) to image a portion of a full-field mask onto a portion of the substrate. The system also includes a light tunnel/homogenizer which outputs a square beam with uniformity of ±5% across the entire output field, producing an 8-mm×8-mm illumination spot at approximately 0.05 NA.

Excimer lasers have also been used to manufacture thin-film transistors (TFTs). For example, "Flat-Panel Displays Slim Down with Plastic", *Science and Technology Review*, Nov. 1999, incorporated herein by reference, discloses using an excimer laser to manufacture TFTs on top of thin, plastic sheets. In this reference, an amorphous silicon dioxide layer acts as a thermal barrier to prevent the plastic (PET) substrate from heating and melting. See also, U.S. Pat. No. 5,714,404 to Mitlitsky et al. and U.S. Pat. Nos. 5,817,550 and 5,856,858 to Carey et al., both incorporated herein by reference, which disclose using an excimer laser for crystallizing a TFT silicon layer and for doping.

It is also known to employ an infra-red (IR) fiber laser for patterning a metallic conductive layer overlying a plastic film, directly ablating the conductive layer by scanning a pattern over the conductor/film structure. See: Int. Publ. No. WO 99/36261 by Polaroid Corporation; and Chu et al., "42.2: A New Conductor Structure for Plastic LCD Applications Utilizing 'All Dry' Digital Laser Patterning," 1998 SID International Symposium Digest of Technical Papers, Anaheim, Calif., May 17–22, 1998, no. VOL. 29, May 17, 1998, pages 1099–1101, both incorporated herein by reference. However, metallic conductive layers formed from silver-based, transparent, conductor materials are relatively expensive. Moreover, employing the aforementioned direct lasering techniques is relatively slow and requires complex laser control mechanisms and algorithms to control and direct the narrow IR laser beam.

Accordingly, a high-speed, high-precision, chemical-free method for patterning conductor/plastic substrate structures is needed. To this end, it would also be desirable to have available a flexible conductor/plastic substrate structure with a "glass replacement" structure which includes material insulating the glass replacement structure from heat generated during laser irradiation of the conductor/substrate structure. A method for patterning conductor/substrate structures which is sufficiently fast to accommodate a roll-to-roll manufacturing process "downstream" of the patterning process would also be useful and potentially yield cost savings in the manufacturing of LCD devices.

SUMMARY OF THE INVENTION

The present invention is embodied in laser-etched multilayered electrode/substrate structures and methods for manufacturing the same. In a preferred embodiment, a projection-type excimer laser system is employed to rapidly and precisely ablate a pattern from a mask into at least one conductive layer of a multilayered conductor/plastic substrate structure.

In a preferred embodiment, the multilayered conductor/plastic substrate structure includes a "protective layer" which creates a "controlled environment" for the laser etching process. The protective layer (e.g., hard coat) serves to protect layers beneath the protective layer from damage caused by laser irradiation of the multilayered electrode/plastic substrate structure. This layer facilitates and speeds the laser etching process. Advantageously, this "protective layer" is a functional layer of a "glass replacement" composite, as discussed below.

In a preferred embodiment, the multilayered conductor/plastic substrate structure incorporates one or more functional layers therein. The one or more functional layers of multilayered electrode/plastic substrate structure serve to insulate, promote adhesion, protect layers underneath from laser irradiation, provide protection from environmental damage, and/or provide protection from structural damage, for example, scratches or cracks in the film.

In a preferred embodiment, the at least one functional layer includes a "barrier layer" (e.g., $SiO_x$) which provides "environmental protection" for the plastic substrate. "Environmental protection" means serving to provide barrier properties against oxygen and/or moisture.

The plastic substrate as constructed with the one or more functional layers can be seen as a "glass replacement" structure, in that various properties of the structure are intended to duplicate various characteristics of the glass substrate, such as the aforementioned barrier properties. The glass replacement structure can be a composite of these layers ("glass replacement" composite), or a single layer where the functional properties are incorporated through, for example, compounding or coextrusion of the plastic substrate ("glass replacement" layer).

A multilayered electrode/substrate structure in accordance with one embodiment of the present invention includes: a plastic substrate; and at least one conductive layer overlying the plastic substrate, the at least one conductive layer being excimer laser-etched into a plurality of discrete conductive elements. In a preferred embodiment, the at least one conductive layer includes an ITO layer which is polycrystalline. In a preferred embodiment, the at least one functional layer serves to: electrically insulate the discrete conductive elements; promote adhesion of the at least one conductive layer to the plastic substrate; protect the plastic substrate from laser irradiation; protect one or more other functional layers including a barrier layer from laser irradiation; protect the plastic substrate from environmental damage caused by exposure to oxygen and/or moisture; or a combination of the above.

A multilayered electrode/substrate structure in accordance with another embodiment of the present invention includes: a plastic substrate; at least one conductive layer overlying the plastic substrate; and at least one functional layer intermediate the plastic substrate and the at least one conductive layer, the at least one functional layer including an insulating material; wherein portions of the at least one conductive layer are excimer laser etched. In a preferred embodiment, the at least one conductive layer includes an ITO layer which is polycrystalline. In a preferred embodiment, the at least one functional layer includes a protective layer which serves to protect layers beneath the protective layer from laser irradiation. In a preferred embodiment, portions of the protective layer underlying the etched portions of the at least one conductive layer are not completely decomposed. In a preferred embodiment, the at least one functional layer includes one or more barrier layer which serves to protect the plastic substrate from environmental damage. In a preferred embodiment, the multilayered electrode/substrate structure further includes an additional functional layer abutting a side of the plastic substrate that faces away from the at least one conductive layer, the additional functional layer serving to provide structural protection and/or environmental protection for the plastic substrate.

A multilayered electrode/substrate structure in accordance with another embodiment of the present invention includes: a substrate; a layer of indium tin oxide (ITO) which is polycrystalline; and at least one functional layer, at least one of which serves as an adhesion promoter of the ITO layer to the substrate; wherein portions of the ITO layer are excimer laser etched. In a preferred embodiment, the at least one functional layer includes a protective layer which serves to protect layers beneath the protective layer from laser irradiation. In a preferred embodiment, portions of the protective layer underlying the etched portions of the at least one conductive layer are not completely decomposed. In a preferred embodiment, the at least one functional layer includes a barrier layer which serves to protect the plastic substrate from environmental damage. In a preferred embodiment, the multilayered electrode/substrate structure further includes an additional functional layer abutting a side of the plastic substrate that faces away from the at least one conductive layer, the additional functional layer serving to provide structural protection and/or environmental protection for the plastic substrate.

A liquid crystal display device in accordance with another embodiment of the present invention incorporates any of the multilayered electrode/substrate structures described herein.

A method for patterning a multilayered conductor/substrate structure in accordance with another embodiment of the present invention includes the steps of: providing a multilayered conductor/substrate structure which includes a plastic substrate and at least one conductive layer overlying the plastic substrate; and irradiating the multilayered conductor/substrate structure with ultraviolet radiation such that portions of the at least one conductive layer are removed therefrom such as through ablation. Preferably, the ultraviolet radiation is spatially incoherent. According to a preferred method, the irradiating step includes employing an excimer laser to ablate portions of the at least one conductive layer. Preferably, the excimer laser is part of a projection-type ablation system which is configured to project a broadened laser beam. Preferably, the excimer laser is controlled in consideration of how well the at least one conductive layer absorbs radiation at particular wavelengths. Preferably, the excimer laser is controlled to image a pattern from a mask onto the at least one conductive layer. Preferably, a fluence of the excimer laser is controlled in consideration of an ablation threshold level of the at least one conductive layer. According to a preferred method, the excimer laser is employed and controlled to ablate portions of the at least one conductive layer without completely decomposing the layer therebeneath. In a preferred embodiment, the layer therebeneath is one or more functional layers.

The above described and many other features and attendant advantages of the present invention will become apparent as the invention becomes better understood by reference to the following detailed description when considered in conjunction with the accompanying drawings.

BRIEF DESCRIPTION OF THE DRAWINGS

Detailed description of preferred embodiments of the invention will be made with reference to the accompanying drawings:

FIG. 6E is a section analysis showing the clean, substantially rectangular cross-section of the line or groove ablated into the multilayered conductor/substrate structure of FIG. 6D.

DETAILED DESCRIPTION OF THE PREFERRED EMBODIMENTS

The following is a detailed description of the best presently known mode of carrying out the invention. This description is not to be taken in a limiting sense, but is made merely for the purpose of illustrating the general principles of the invention.

The present invention exploits a critical relationship between the wavelength of laser light and the absorption characteristics of the conductor layer. Knowledge of this relationship facilitates precise control of internal film behavior during the patterning process.

Figure 1:
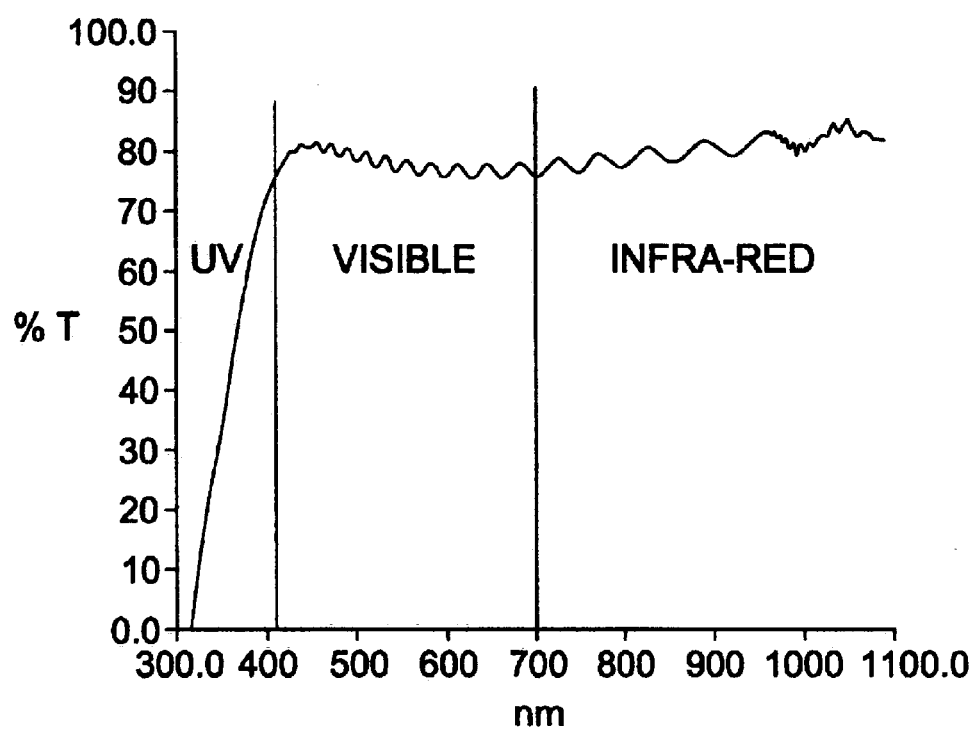
FIG. 1 is a plot of the transmission rate as a function of wavelength for a film with a conductive layer of ITO.

Referring to FIG. 1, the transmission rate as a function of wavelength for a film with a conductive layer of ITO is shown. The ITO is very transparent to infra-red light. The transmission rates shown in FIG. 1 make the use of IR (mean IR) lasers impractical for high-speed patterning of this kind of conductive layer due to the very low etch rates achievable. Moreover, high power IR lasers are needed for low to medium speeds.

Figure 2:
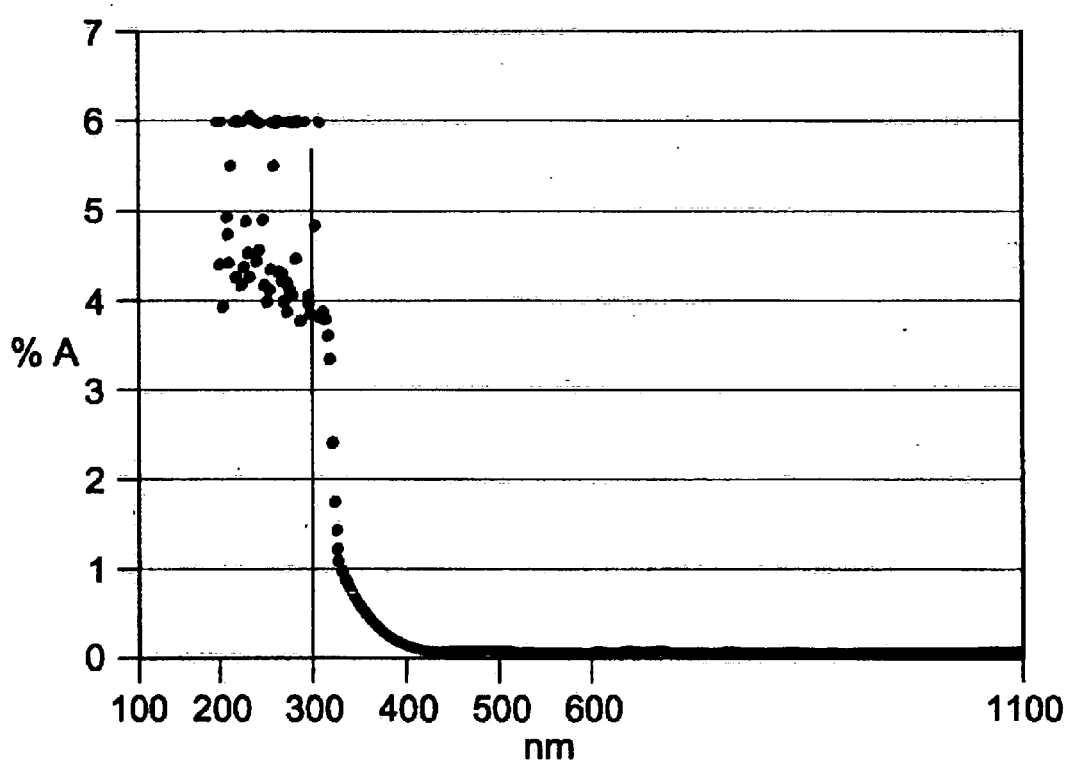
FIG. 2 is a plot of the absorption rate as a function of wavelength for a film with a conductive layer of ITO.

As seen in FIG. 2, this film has much higher absorption rates at UV light wavelengths (<350 nm), for example, ~3.5% at 308 nm. Therefore, UV lasers are more suited for this film given that the very high power IR lasers need for ablating ITO produce high amounts of heat which can quickly damage the plastic layers of the film.

Among the UV lasers, the preferred laser for implementing the present invention is an excimer laser because of its powerful outputs and because excimer lasers are readily used in lithography systems employing masks. This is possible because of the high exposure power and the spatial incoherence of excimer lasers which make wafer exposure times shorter than with other UV lights. The choice of an excimer laser is particularly preferred when the substrate is plastic in order to lessen the amount of heat generated by the laser and conducted to the plastic layer(s). The spatial incoherence of excimer lasers (in contrast with other widely used lasers) makes speckles much less likely. Speckles (interference patterns) make high resolution imaging rather impractical. Transparent conductive materials are widely made of transparent conductive oxide films having optical energy gaps of 3 to 4 eV and are not effectively processed by IR lasers (of photon energies of around 1.5 eV). The wavelength of the excimer laser is no longer than 400 nm equivalent to photon energies higher than 3.1 eV. Excimer lasers also have a very short pulse width delivering their energy in nanoseconds.

Figure 3:
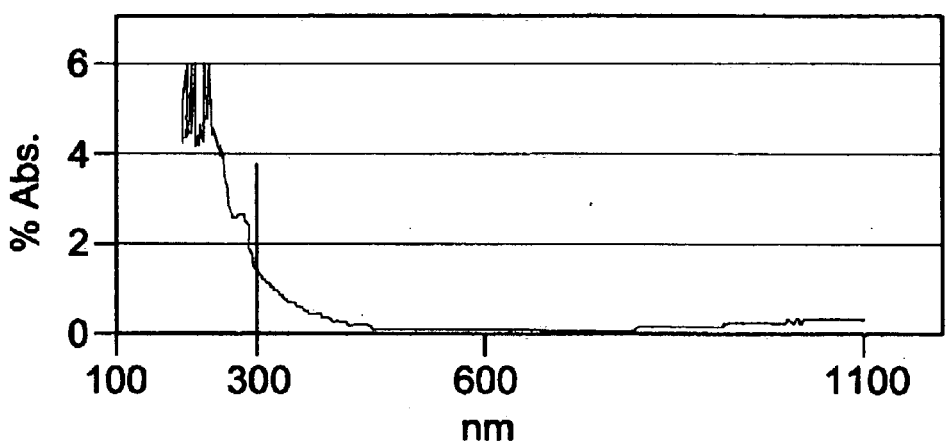
FIG. 3 is a plot of the absorption rate as a function of wavelength for a film with a conductive layer comprising an Au/Ag/Au layer and an ITO layer formed thereover.

FIG. 3 shows the absorption rate as a function of wavelength for a film with a conductive layer comprising an Au/Ag/Au layer and an ITO layer formed thereover, illustrating how the selection of different materials for the conductor/plastic substrate structure results in different absorption characteristics. For example, the absorption rate for this film is ~1.0–1.5% at 308 nm. At IR wavelengths, this film exhibits somewhat higher absorption than the film of FIG. 2 because of the Au/Ag/Au layer.

Figure 4:
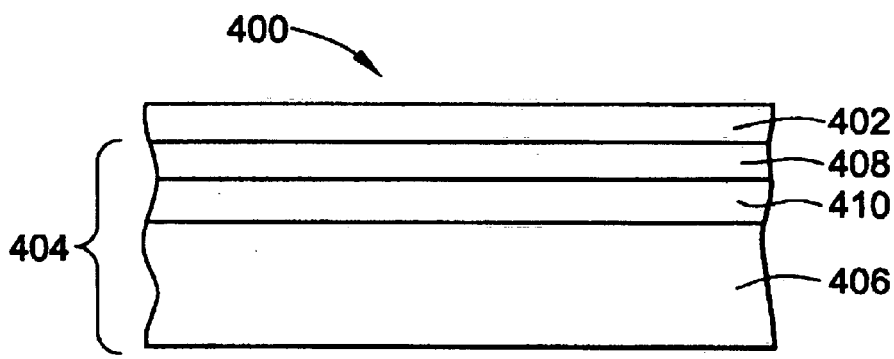
FIG. 4 is a cross-sectional view of an exemplary preferred conductor/plastic substrate structure according to the present invention.

Referring to FIG. 4, an exemplary preferred conductor/plastic substrate structure 400 according to the present invention comprises at least one conductive layer 402 and a multilayer structure 404 which functions as a "glass replacement" composite. The at least one conductive layer 402 is preferably formed from material(s) selected to satisfy the following three criteria: high transparency (at least 80% transmission at visible light wavelengths), low resistivity (1–80Ω/square), and environmental stability. Another important criteria of the at least one conductive layer 402 is flexibility to prevent cracking of electrodes from roll-to-roll processing. The at least one conductive layer 402 comprises, for example, an oxide layer (e.g., ITO), a metal-based layer (e.g., silver-based, palladium-based), an alloy layer (e.g., ITO alloy, silver alloy), a doped layer (e.g., ITO doped with cerium oxide), a multilayered conductive film (e.g., Au/Ag/Au), or a combination of the above.

Indium tin oxide (ITO) is a cost effective conductor with good environmental stability, up to 90% transmission, and down to 20Ω/square resistivity. An exemplary preferred ITO layer 402 has a % T≧80% in the visible region of light (>400 nm to 700 nm) so that the film will be useful for display applications. In a preferred embodiment, the at least one conductive layer 402 comprises a layer of low temperature ITO which is polycrystalline. The ITO layer is preferably 10-120 nm in thickness, or 50–100 nm thick to achieve a resistivity of 20-60 Ω/square on plastic. An exemplary preferred ITO layer is 60–80 nm thick.

The at least one conductive layer 402 can comprise other metal oxides such as indium oxide, titanium dioxide, cadmium oxide, gallium indium oxide, niobium pentoxide and tin dioxide. See, Int. Publ. No. WO 99/36261 by Polaroid Corporation. In addition to a primary oxide such as ITO, the at least one conductive layer 402 can also comprise a secondary metal oxide such as an oxide of cerium, titanium, zirconium, hafnium and/or tantalum. See, U.S. Pat. No. 5,667,853 to Fukuyoshi et al. Other transparent conductive oxides include, but are not limited to: $ZnO_2$, $Zn_2SnO_4$, $Cd_2SnO_4$, $Zn_2In_2O_5$, $MgIn_2O_4$, $Ga_2O_3$-$In_2O_3$, Ta $O_3$, etc. The at least one conductive layer 402 is formed, for example, by a (low temperature) sputtering technique or by a direct current sputtering technique (DC-sputtering or RF-DC sputtering) depending upon the material(s) of the underlying layer.

For higher conductivities, the at least one conductive layer 402 comprises a silver-based layer which contains silver only or silver containing a different element such as aluminum (Al), copper (Cu), nickel (Ni), cadmium (Cd), gold (Au), zinc (Zn), magnesium (Mg), tin (Sn), indium (In), tantalum (ta), titanium (Ti), zirconium (Zr), cerium (Ce), silicon (Si), lead (Pb) or palladium (Pd). See, U.S. Pat. No. 5,667,853 to Fukuyoshi et al. In a preferred embodiment, the at least one conductive layer 402 comprises at least one of gold, silver and a gold/silver alloy, for example, a layer of silver coated on one or both sides with a thinner layer of gold. See, Int. Publ. No. WO 99/36261 by Polaroid Corporation. These higher conductivity conductor structures are formed, for example, employing a direct sputtering technique.

The elements aluminum (Al), copper (Cu), nickel (Ni), cadmium (Cd), gold (Au), zinc (Zn), magnesium (Mg), tin (Sn), indium (In), tantalum (ta), titanium (Ti), zirconium (Zr), cerium (Ce), silicon (Si), lead (Pb) or palladium (Pd) can also be used in other conductive elements or alloys to form the conductive layer 402.

The "glass replacement" structure 404 comprises a substrate 406 and at least one "functional layer" intermediate the at least one conductive layer 402 and the substrate 406. In the exemplary preferred embodiment shown in FIG. 4, the at least one functional layer comprises a protective layer 408 and a barrier layer 410. The protective layer 408 (e.g., acrylic hard coat) functions to prevent laser light from penetrating to functional layers intermediate the protective layer 408 and the substrate 406, thereby protecting—in the illustrated exemplary preferred embodiment—both the barrier layer 410 and the substrate 406. An exemplary preferred protective layer 408 also serves as an adhesion promoter of the at least one conductive layer 402 to the substrate 406.

The barrier layer 410 (e.g., $SiO_x$, $AlO_x$, ITO) is preferably inorganic and functions to protect layers underneath from environmental damage caused by exposure to oxygen and/or water, etc. and acts as an adhesion promoter. The barrier layer 410 protects, for example, against the presence of moisture in the LC cell which may lead to the formation of black spots. As the LCD cell gap shrinks, the requirement in barrier performance increases because fewer water molecules are needed to form a visible black spot. It is believed that the outer barrier layer—i.e. the layer that protects the LCD cell from the environment—works with the inner barier layer to prevent void formation in the film. These voids are manifested as black spots. Without the outer barrier layer, heat and relative humidity is believed to cause film deformation and moisture incursion, contributing to void formation. It has been observed that $SiO^x$ barrier layers are effective in countering this phenomenon. An exemplary preferred barrier layer 410 acts as a gas barrier (e.g., with an oxygen transmission rate (OTR) no greater than 0.1 cc/m$^2$/day). As between $SiO_x$, $AlO_x$ and ITO, it has been observed that OTR decreases in the order: $AlO_x$>ITO>$SiO_x$. Another exemplary preferred barrier layer 410 acts as a moisture barrier (e.g., with a water vapor transmission rate (WVTR) no greater than 0.1 g/m$^2$/day). As between $SiO_x$, $AlO_x$ and ITO, it has been observed that WVTR decreases in the order: $AlO_x$>$SiO_x$>ITO. Although the protective layer 408 is shown in FIG. 4 overlying the barrier layer 410, alternatively these layers can by provided with the barrier layer 410 overlying the protective layer 408.

An exemplary preferred substrate 406 comprises a visible light-transmitting material, preferably a flexible material such as plastic or a plastic film. "Plastic" means a high polymer, usually made from polymeric synthetic resins, which may be combined with other ingredients, such as curatives, fillers, reinforcing agents, colorants, and plasticizers. A "resin" is a synthetic or naturally occurring polymer. Plastic is solid in its finished state, and at some stage during its manufacture or processing into finished articles, can be shaped by flow. Plastic includes thermoplastic materials and thermosetting materials.

An exemplary preferred substrate 406 comprises heat-stabilized polyethylene terephthalate (HS-PET). However, other appropriate plastic substrates can be used, such as polyethylenenapthalate (PEN), polycarbonate (PC), polyarylate (PAR), polyetherimide (PEI), polyethersulphone (PES), polyimide (PI), Teflon poly(perfluoro-alboxy) fluoropolymer (PFA), poly(ether ether ketone) (PEEK), poly (ether ketone) (PEK), poly(ethylene tetrafluoroethylene) fluoropolymer (PETFE), and poly(methyl methacrylate) and various acrylate/methacrylate copolymers (PMMA). Certain of these plastic substrates can withstand higher processing temperatures of up to at least about 200° C. (some to 300°–350° C.) without damage. Various cyclic polyolefins—for example, ARTON made by JSR Corporation, Zeonor made by Zeon Chemicals L.P., and Topas made by Celanese AG—are also suitable for the substrate 406. Other low-temperature plastic substrates (both flexible and rigid) can also be used, including: ethylene-chlorotrifluoro ethylene (E-CTFE), made under the trademark HALAR by Ausimont U.S.A., Inc., ethylene-tetra-fluoroethylene (E-TFE) made under the trademark TEFZEL by Dupont Corporation, poly-tetrafluoro-ethylene (PTFE), fiber glass enhanced plastic (FEP), and high density polyethylene (HDPE). Although various examples of plastic substrates are set forth above, it should be appreciated that the substrate 406 can also be formed from other materials such as glass and quartz.

In an exemplary preferred application as the core of a FMLCD film, the substrate 406 (for example, 200 μm in thickness) is by far the thickest layer of the film construction. Consequently, the substrate determines to a large extent the mechanical and thermal stability of the fully structured FMLCD film. An exemplary preferred substrate 406, therefore, is formed from a material which is stable at 135° C. for 6 hours, resistant to 1" mandrel cracking, and >2H pencil hardness.

Figure 5:
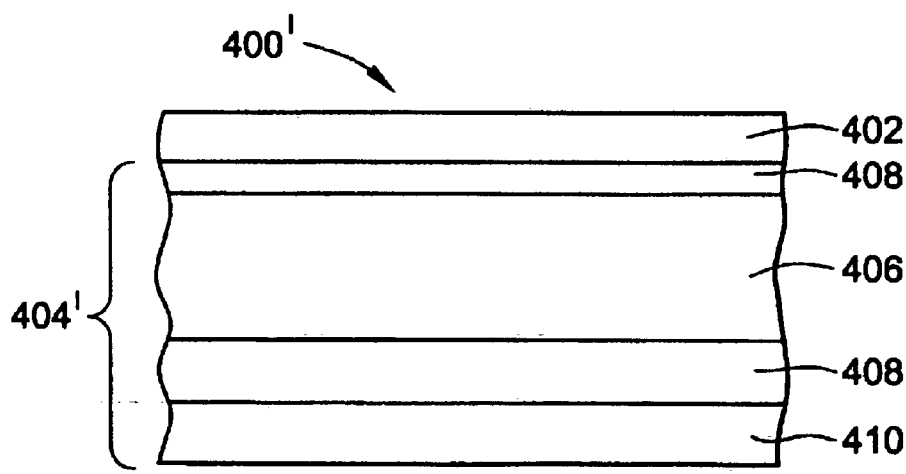
FIG. 5 is a cross-sectional view of another exemplary preferred conductor/plastic substrate structure according to the present invention.

Referring to FIGS. 4 and 5, elements with like numerals are the same unless otherwise noted. In FIG. 5, another exemplary preferred conductor/plastic substrate structure 400' according to the present invention comprises at least one conductive layer 402 and an alternative "glass replacement" structure 404' which additionally serves to provide the underside of the substrate 406 with structural protection (e.g., scratch and drop resistance) and/or environmental protection. The alternative "glass replacement" structure 404' is provided with at least one "functional layer" overlying the substrate 406 and at least one additional "functional layer" underlying the substrate 406. In the illustrate exemplary preferred embodiment, two protective layers 408 are provided adjacent the upper surface and the lower surface of the substrate 406, respectively. The illustrated alternative "glass replacement" structure 404' also includes a barrier layer 410 underlying the lower protective layer 408. It should be appreciated that combinations and arrangements of protective layers 408, barrier layers 410 and other functional layers different from those shown in FIGS. 4 and 5 are also within the scope of the present invention.

The illustrated exemplary preferred "glass replacement" structures 404, 404' include specific, functional layers intermediate the at least one conductive layer 402 and the substrate 406 and/or on the other side of the substrate 406 as described above. However, an integrally-formed "glass replacement" structure (i.e., without specific functional layers) is also within the scope of the present invention. Such a structure encompasses one or more of the functionalities of the above-described functional coatings and, in a preferred embodiment, provides gas and/or moisture barriers, adhesion to inorganic conductive coatings, scratch resistance, and the environmental stability of glass.

Figure 6A:
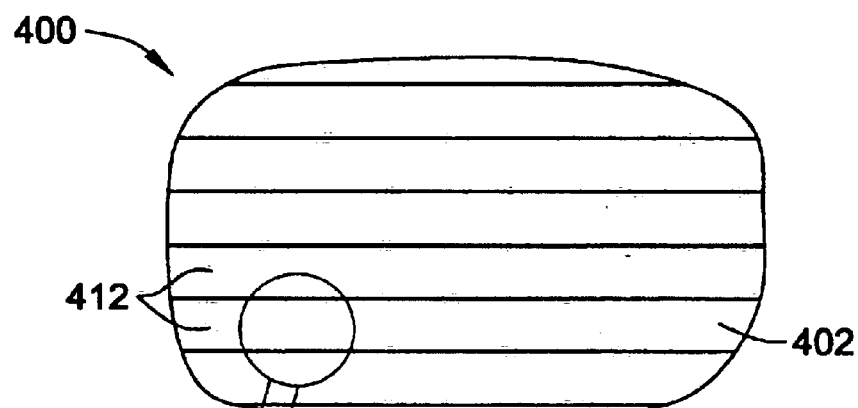
FIG. 6A is a partial top view of an etched conductor/plastic substrate structure.

An exemplary preferred method for patterning a multi-layered conductor/substrate structure according to the present invention includes the steps of: providing a multi-layered conductor/substrate structure 400 (as described above); and irradiating the multilayered conductor/substrate structure 400 with ultraviolet radiation such that portions of the at least one conductive layer 402 are ablated therefrom. Referring to FIG. 6A, which shows a partial view of a visible region of a display device, a conductor/substrate structure 400 is shown with its at least one conductive layer 402 patterned into a plurality of electrodes 412. In the illustrated exemplary preferred embodiment, the electrodes 412 are parallel. Two conductor/substrate structures 400 so patterned can be used to form a LCD device. For example, two such substrates 400 are positioned facing each other and cholesteric liquid crystals are positioned therebetween to form a FMLCD device.

Figure 6B:
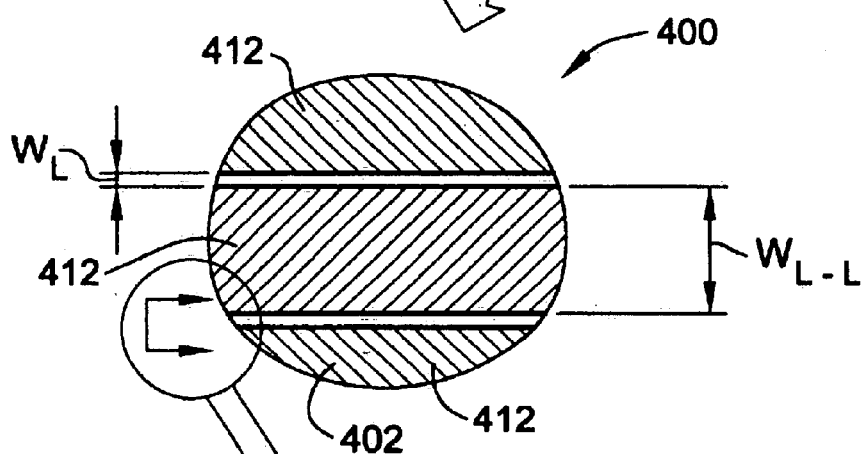
FIG. 6B is an enlarged view of portion of the conductor/plastic substrate structure of FIG. 6A.
Figure 6C:
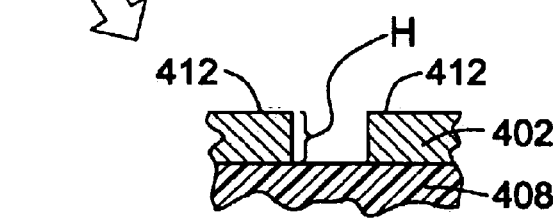
FIG. 6C is a cross-sectional side view of the conductor/plastic substrate structure of FIG. 6B.

Referring to FIGS. 6B and 6C, illustrative dimensions for a patterned ITO conductive layer 402 are: line widths ($W_L$) of 10 microns; distances between lines (i.e. electrode widths) ($W_{L-L}$) of 200 microns; depth of cut (i.e. thickness of ITO conductor) (H) of 100 nanometers. ITO thicknesses on the order of 60, 70, and greater than 100 nanometers are also possible. For FMLCD applications, the "line gap" is preferably less than 4 times the "cell gap". If the line width exceeds this x4 value, the driving voltage requirements increase to unacceptable levels (60, 70, 100 volts). A target line width of 10 microns provides a safe margin of error for the cell geometry.

Figure 6D:
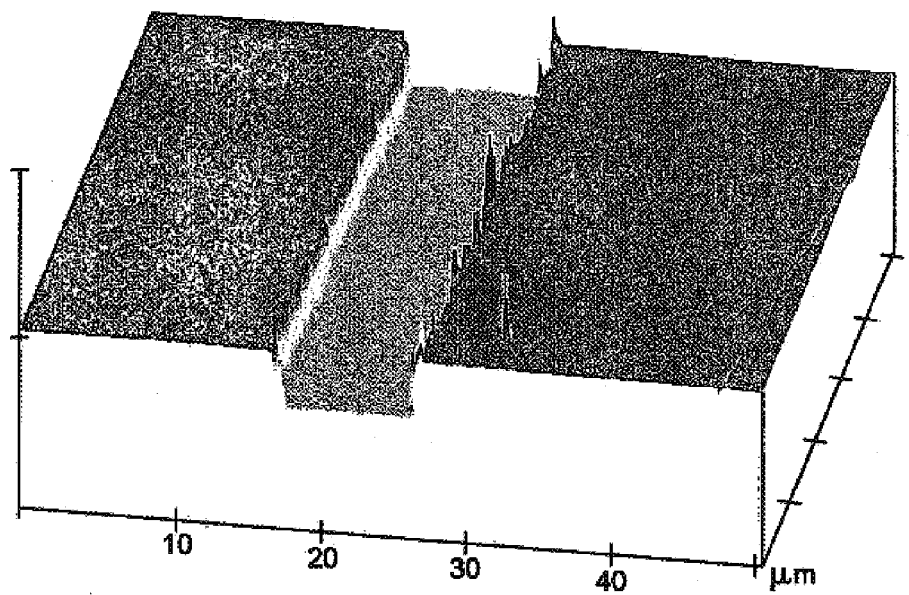
FIG. 6D is an atomic force microscope image which shows a line ablated into a multilayered conductor/substrate structure according to the present invention.

FIG. 6D is an atomic force microscope image which shows a line ablated into a multilayered conductor/substrate structure according to the present invention. The film under test comprised, from bottom to top, a PET substrate (175 μm), a $SiO_x$ layer, an acrylic hard coat (~1 μm), and an ITO layer (~115 nm). The line was ablated employing a XeCl excimer laser at 308 nm wavelength, frequency 50 Hz (rep rate), at a fluence of 183 $mJ/cm^2$. The section analysis presented in FIG. 6E shows a clean, substantially rectangular cross-section of the line (or groove) ablated into the multilayered conductor/substrate structure of FIG. 6D.

Figure 7:
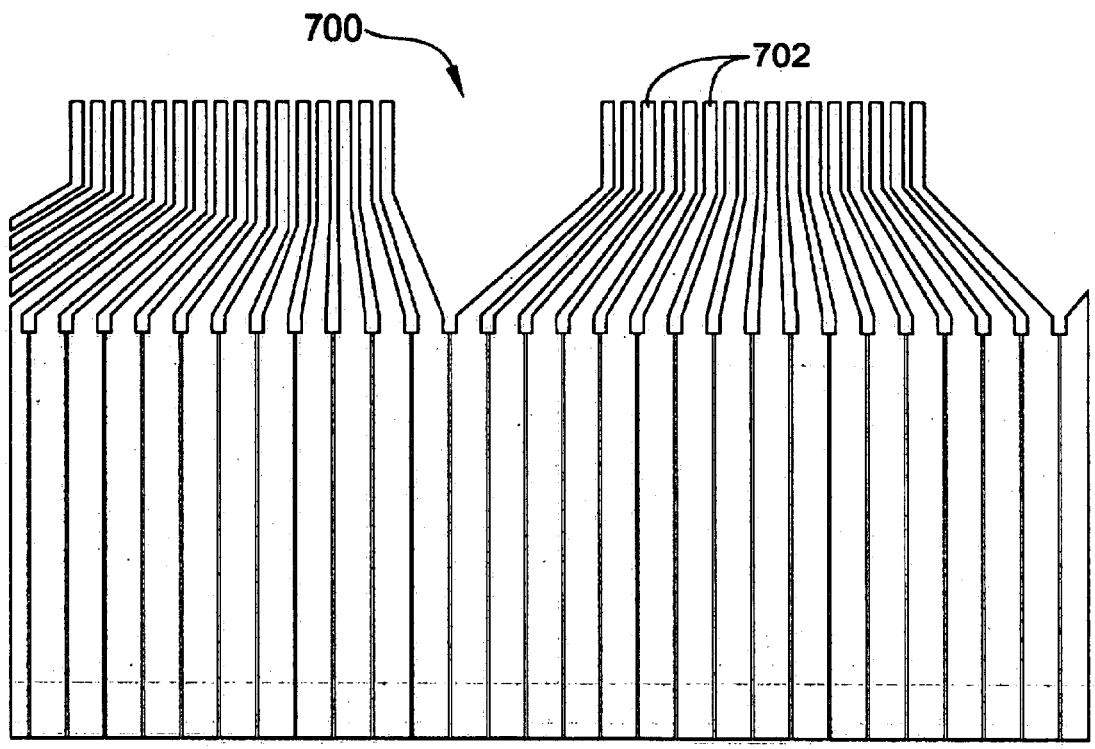
FIG. 7 is a top view of an exemplary electrode/substrate structure according to the present invention.

According to an exemplary preferred method of the present invention, an excimer laser is employed to ablate portions of the at least one conductive layer 402 to form an electrode/substrate structure. In FIG. 7, an exemplary electrode/substrate structure 700 with discrete conductive elements 702 is shown. It should be understood that a great many differently patterned electrode/substrate structures can be formed employing the principles of the present invention.

Figure 8:
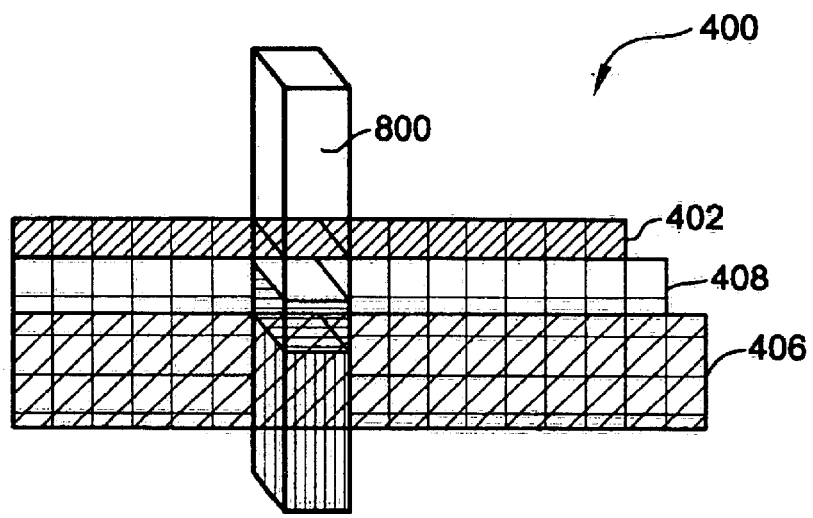
FIG. 8 shows excimer laser irradiation of a conductor/substrate structure.

FIG. 8 shows excimer laser irradiation of the conductor/substrate structure 400 with a beam 800. The excimer laser is controlled in consideration of how well the at least one conductive layer 402 absorbs radiation at particular wavelengths. Preferably, the excimer laser is controlled to image a pattern from a mask onto the at least one conductive layer 402.

According to the present invention, characteristics of the beam 800 are defined by: parameters relative to the delivery of exposure dose (average power, pulse energy, repetition rate, pulse width); parameters relative to the temporal coherence of the laser (spectral bandwidth); and parameters relative to the spatial coherence of the laser (beam dimensions, beam divergence, beam uniformity). In an exemplary preferred embodiment, a laser is employed which provides a range of energy per pulse of 50–1,000 mJ/cm$^2$, spectrally narrowed laser wavelengths with the difference between longer and shorter wavelengths being ⊆0.003 nm, large beam dimensions (e.g., 7 mm×7 mm (~50 mm$^2$) broadened laser beam), and beam uniformity better than 2%. Depending upon the material(s) from which the at least one conductive layer 402 is formed, the fluence (e.g., 180 mJ/cm$^2$) and/or number of pulses (e.g., one pulse, two pulses, etc.) is controlled to ablate a desired amount of material from the conductor/substrate structure 400.

When the at least one conductive layer 402 comprises ITO, the beam 800 preferably comprises (spatially incoherent) UV radiation with a discrete characteristic wavelength of 308 nm or 248 nm. It should be appreciated, however, that the principles of the present invention are not limited to these particular wavelengths. An exemplary preferred light source for patterning ITO comprises a medium UV excimer laser. An exemplary preferred UV light sources is a XeCl (308 nm) excimer laser. This light source is generally preferable to a KrF (248 nm) excimer laser because of the availability of advanced industrial XeCl lasers and because HCl gas is easier to handle than F$_2$ for KrF lasers. Also, the longer wavelengths of UV light are more suitable to optics than the shorter wavelengths. It should be appreciated, however, that the present invention is not limited to employing medium UV light sources, particularly when the material(s) of the at least one conductive layer 402 have good absorption characteristics in other regions of the electromagnetic spectrum. Thus, the principles of the present invention are also applicable to conductive materials yet to be discovered and/or developed, as well as to materials which are not yet publicly known or known to be suitable for rendering into conductive materials for conductor/substrate structures.

In one embodiment of the present invention, the protective layer 408 comprises a material (such as acrylic) which expands when heated under certain circumstances. In this embodiment, the material(s) from which the at least one conductive layer 402 is formed are carefully selected, and the process of irradiating the at least one conductive layer 402 is precisely controlled such that the irradiated portion of the at least one conductive layer 402 is heated and cracked and a portion of the underlying protective layer 408 swells (as conceptually illustrated in FIG. 9) due primarily to energy thermally conducted through the at least one conductive layer 402, rather than light transmitted through the at least one conductive layer 402 to the protective layer 408. As discussed below in greater detail, ablation processes can be tailored to facilitate controlled swelling of the underlying protective layer 408 which can help or "assist" the at least one conductive layer 402 to be etched away with greater speed and precision.

Figure 9:
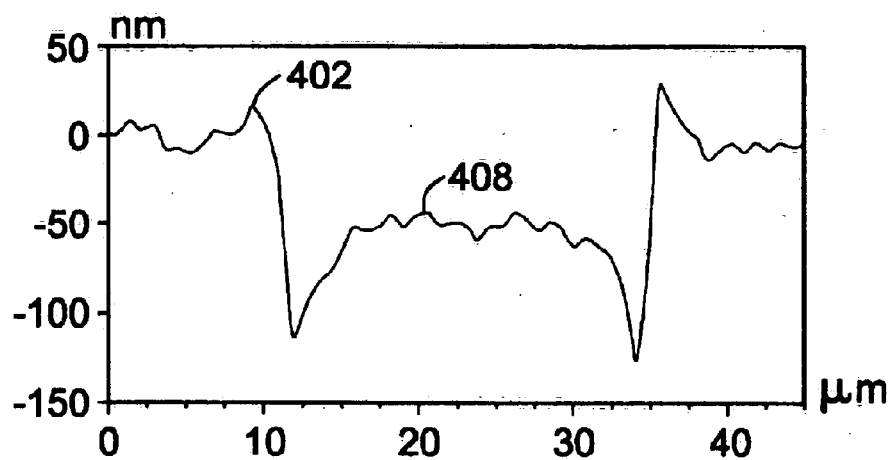
FIG. 9 conceptually illustrates how the method of the present invention can, in some circumstances, employ an assist mechanism whereby the protective layer swells to assist in the removal of the at least one conductive layer during the ablation process.

Referring to FIG. 9, this cross-sectional view of an etched line shows that portions of the protective layer 408 underlying the etched portions of the at least one conductive layer 402 are not completely decomposed. The amount of decomposition and degree of swelling are controlled by precisely tuning the fluence of the laser in consideration of the material(s) from which the at least one conductive layer 402 and the protective layer 408 are formed and their respective thicknesses. In some circumstances, the material(s) from which the substrate 406 is formed are also taken into consideration in determining how the laser is to be employed and controlled and/or the substrate 406 also contributes to the "assist" mechanism.

In an exemplary preferred embodiment of the present invention, only a minor part of the protective layer 408 is damaged during the patterning process. Thus, the protective layer 408 in such an embodiment is electrically insulative to prevent shorts between the discrete conductive elements formed by the patterning process.

When the at least one conductive layer 402 is ITO, part of the energy is absorbed by the hardcoat (acrylic) protective layer 408, even though the ITO conductive layer 402 does not pass much of the laser light. Acrylic can only sustain temperatures up to around 200° C., whereas the melting temperature of ITO is much higher. At temperatures in the range of 200–250° C., acrylic decomposes. Acrylic, like other (organic) polymers, has relatively low thermal conductivity. Therefore, lateral damage is minimized.

The ITO conductive layer 402 has a very low transmittance at the wavelength of 308 nm (and less at 248 nm). Therefore, only a negligible percentage of the light is transmitted through the ITO conductive layer 402 to the acrylic protective layer 408. Rather, the acrylic is heated by conducted thermal energy from the ITO conductive layer 402. The amount of swelling depends upon the level of energy transferred to the protective layer 408 (which depends upon the thermal conductivity of the at least one conductive layer 402), the composition of the protective layer 408, and the glassification temperature (Tg) of the protective layer 408. Because of the low thermal conductivity of acrylic, the portion of the protective layer 408 which is close to the ITO conductive layer 402 heats and swells pushing up the portion of the ITO conductive layer 402 on top (which is now very much heated) out of the layer 402. This phenomenon helps increase the etching speed and enhance the precision of the cut with very well defined edges.

Thus, in the embodiment described above, an excimer laser is employed to indirectly heat the acrylic protective layer 408 adjacent the ITO conductive layer 402 causing the acrylic protective layer 408 to swell and push the ITO out of the groove. This swelling mechanism has been observed where "large exposure areas" (typically 50 μm wide or more) have been exposed for ITO removal. Remaining portions of the acrylic protective layer 408 constitute a functional part of the film as hardcoat. The ablation mechanism observed for ITO is discussed below in greater detail.

Different films were irradiated under excimer laser radiation of 308 nm and fluences in the range of 90 to 230 mJ/cm2, and it was observed that the size of the particles generated from the ITO removal appears to be inversely related to the energy levels of the excimer laser. The ITO was removed in the form of large particles at lower laser fluences and gradually by increasing the fluence the debris became smaller and smaller.

Also it was observed that at the laser wavelength of 308 nm there does not appear to be a direct relation between the energy level of the laser beam and the depth of the grooves. Although the lines are much cleaner (no ITO large particles) at higher energies and significantly more uniform over all of their length, the grooves are not deeper than grooves (with properly removed particles) formed employing mid-energy levels.

The protective layer underneath the ITO does not play a primordial role in the removal of the ITO layer until the heat generated in the lower ITO layers is enough to thermally decompose and swell the underneath polymer layer. This can only happen at levels of energy equal to or greater than the ablation threshold level (at which there is complete removal of ITO for a given film).

It is believed that the major mechanism to which the observed results can be attributed obeys a photo-thermal model. The absorbed photon energy results in thermally activated fragmentation of the material and is rapidly converted into the kinetic energy of the rejected particles. It is believed that the formation of small debris at higher energy levels originates from the ablation of the upper layers of the ITO film where the high (laser induced) temperature causes rapid mechanical scission of the layer. These ejected fragments are then involved in collisional processes in the ablation plume. When material removal is sufficiently high, an increased number of collisions occurs resulting in the small size debris. Only the layers of ITO where this activated fragmentation is sufficiently high can participate in the process. The rapid conversion of the energies leaves the lower layers at low temperature and therefore almost intact.

In contrast with the above, the high mass fragments at mid-energy levels are believed to originate from lower layers of the ITO where the high temperatures cause the same mechanical scission of the ITO layer. However, the large fragments are ejected at lower speeds. The smaller ablation plume expansion at these fluences does not involve the ejected material in an intense collisional process; therefore, these fragments result in large size debris. This mechanism also explains why there is no observed direct relation between the increase in the laser energy level and the measured depth of the grooves formed by the ablation process. At the low to mid fluences, the absorbed photon energy which results in thermally activated fragmentation of the material is not high enough to completely and rapidly convert into kinetic energy. Therefore, the heat is conducted into the lower layers of the ITO resulting in dispersed fragmentation and large particle formation. The converted (into kinetic energy) part of the thermal energy pushes the particle up. These large debris are often re-deposited near the grooves or even stay inside the grooves due to insufficient kinetic energy, but such grooves can be deeper than with the higher energies because deeper layers of the ITO have been involved in the process.

The processes described herein are suitable for high-speed ablation of ITO or other conductive layers for patterning electrical circuitry on a conductive layer on top of a plastic (polymer) film construction for use in the display industry. Possible display industry applications include, but are not limited to: ultralight, flexible, and inexpensive displays for notebook and desktop computers, instrument panels, video game machines, videophones, mobile phones, hand-held PCs, PDAs, e-books, camcorders, satellite navigation systems, store and supermarket pricing systems, highway signs, informational displays, smart cards, toys, and other electronic devices.

The principles of the present invention are applicable to laser engraving substrates (plastic substrates, in particular) for use in zero field multistable cholesteric liquid crystal displays. These substrates can contain a conductive matrix that provides a path for a drive voltage to be conveyed to the contained CLCs. The conductive matrix defines pixel locations of the liquid crystals contained by these substrates. For zero field multistable displays which do not require polarizers, analyzers, color filters or backlighting components, their resulting thinness makes them particularly well suited for construction of large-sized displays with overlapping display segments without distortion of the spatial integrity of the image. See, e.g. U.S. Pat. No. 5,889,566 to Wu et al., incorporated herein by reference. Full-color capability can be achieved, for example, by alternately filling channels inscribed in the substrate with cholesteric liquid crystals having wavelength maxima reflections in the red, green and blue (RGB) regions of the visible spectrum. Full-color capability can also be achieved by overlapping of RGB layers. Although a preferred application involves zero field multistable cholesteric liquid crystal displays, it should be understood that the principles of the present invention are also applicable to other types of liquid crystal displays as well as organic light emitting devices (OLEDs).

Figure 10:
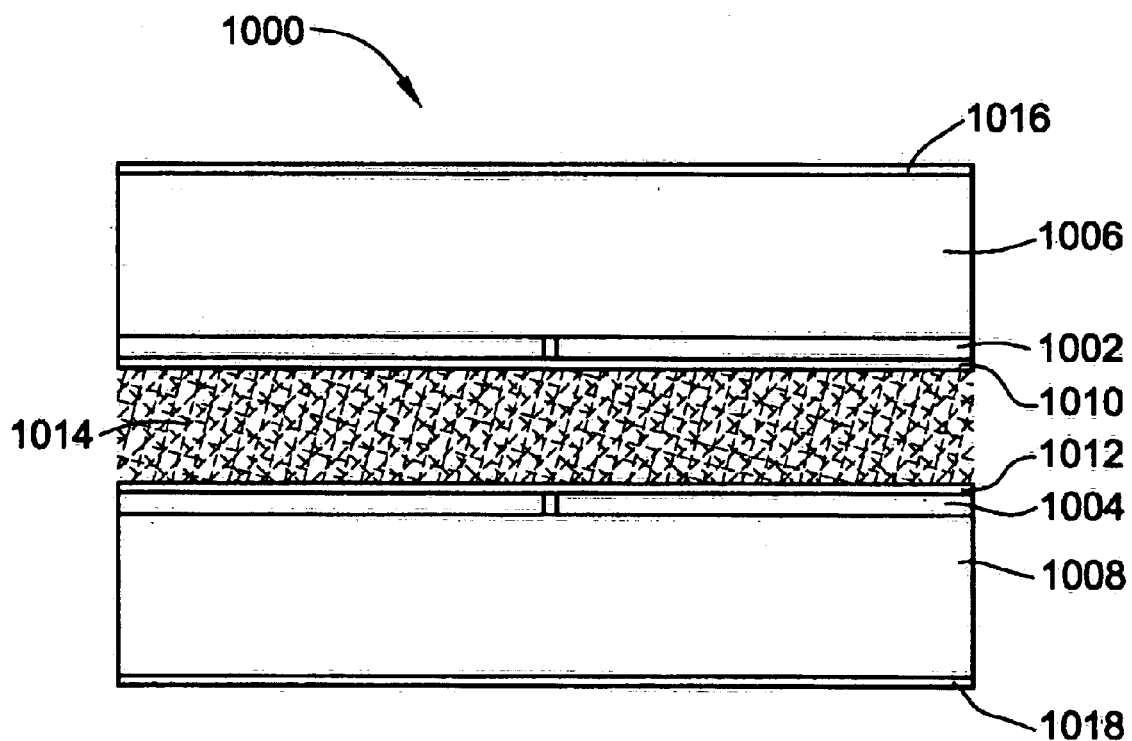
FIG. 10 is a cross-sectional view of an exemplary preferred fast multistable liquid crystal displays (FMLCD) cell structure according to the present invention.
Figure 11A:
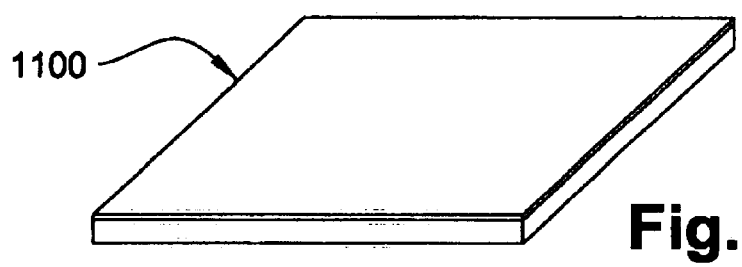
FIGS. 11–13 illustrate back and front panel processing and panel mating according to the present invention.
Figure 11B:
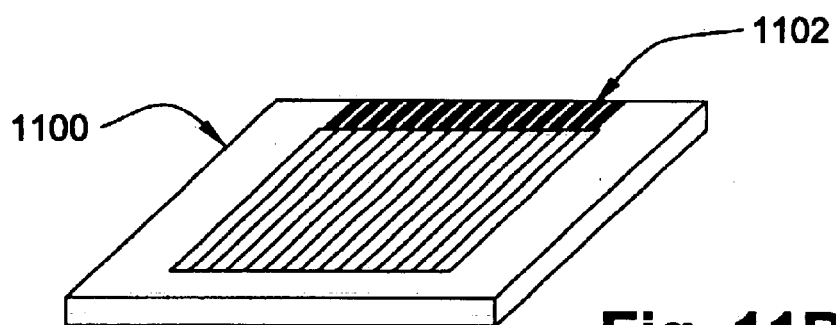
Figure 11C:
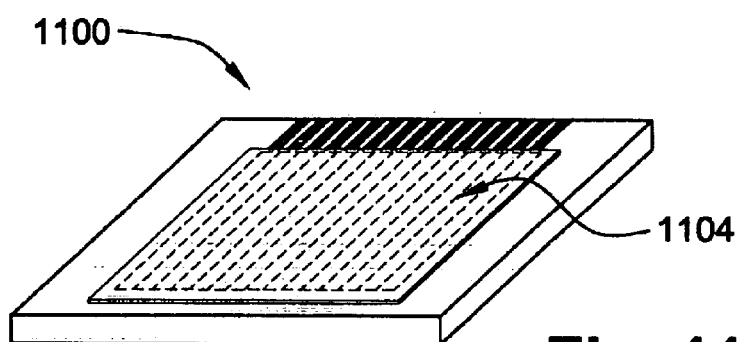
Figure 11D:
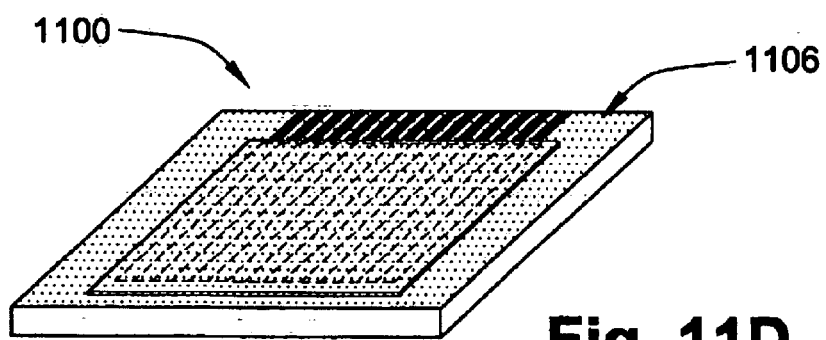
Figure 12A:
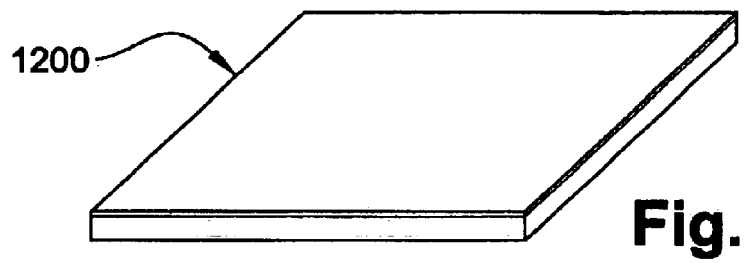
Figure 12B:
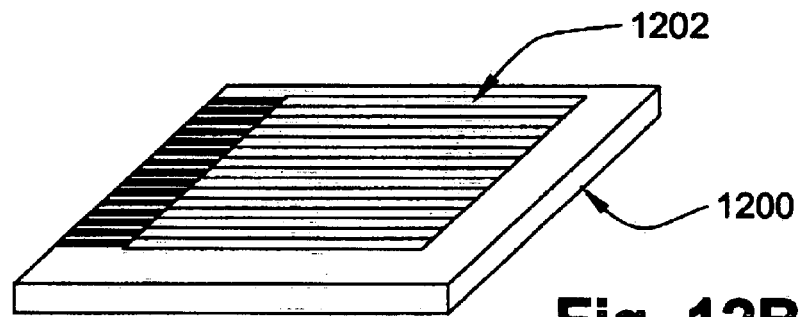
Figure 12C:
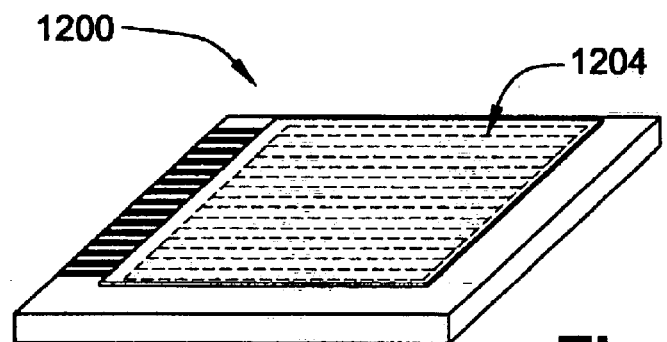
Figure 12D:
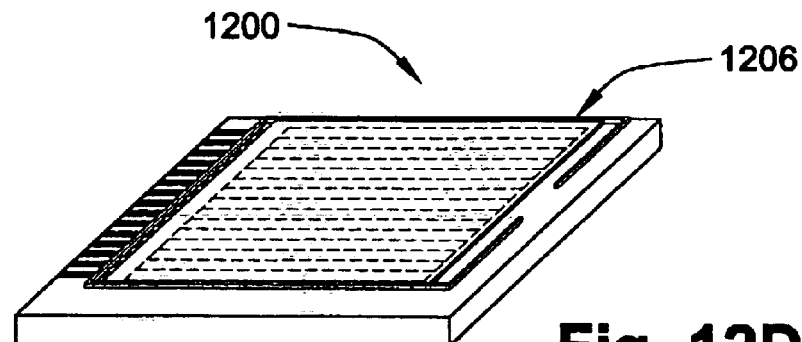

Referring to FIG. 10, an exemplary preferred fast multistable liquid crystal displays (FMLCD) cell structure 1000 comprises electrodes 1002, 1004, their respective substrates 1006, 1008 and index match boundaries 1010, 1012 and a liquid crystal formulation 1014 (CLC) sandwiched therebetween. In a preferred embodiment, the electrodes 1002, 1004 are patterned into conductive matrices which define pixel, or sub-pixel, locations and provide drive voltage paths for the pixel, or sub-pixel, locations. By applying a voltage across the electrodes associated with a portion of the display, that portion is selectively driven (e.g., by drive circuitry) to an "on" or "off" state. An exemplary preferred FMLCD cell structure 1000 is intrinsic reflective (front-lit) and includes an anti-reflective coating 1016 on the substrate 1006 (substantially transparent) and a black coating 1018 on the substrate 1008 as shown. It should be understood, however, that the principles of the present invention are also applicable to back-lit LCDs.

Figure 13A:
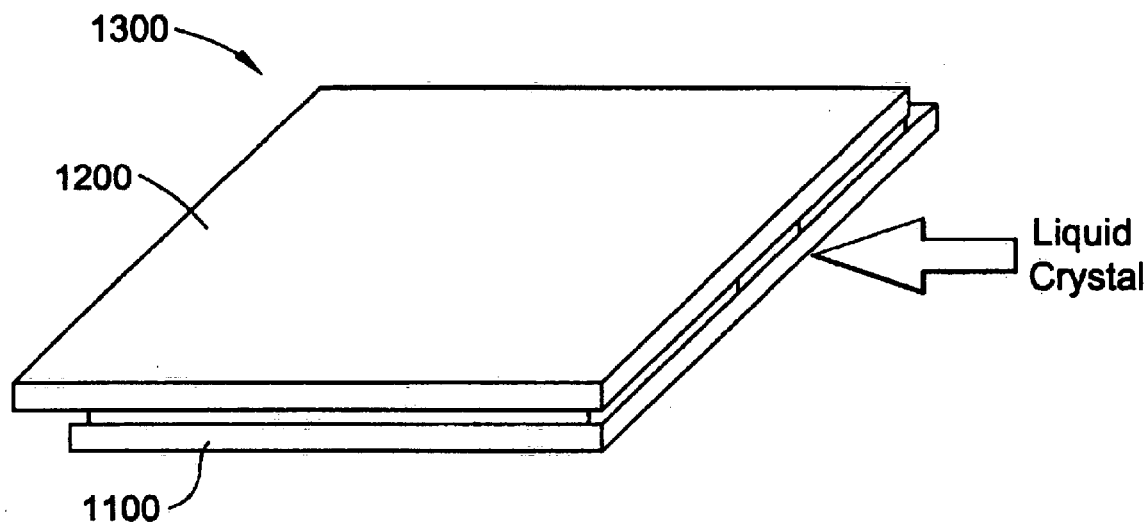
Figure 13B:
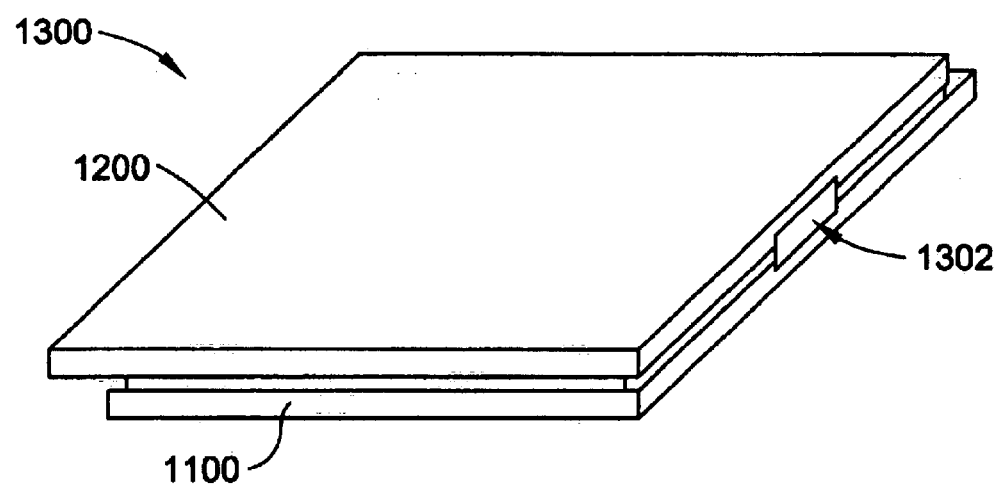

FIGS. 11–13 illustrate back and front panel processing and panel mating according to the present invention. An incoming back panel (conductive film) 1100 (FIG. 11A) is laser etched to create conductive columns 1102 (FIG. 11B). Next, polyimide 1104 (FIG. 11C) is printed over the conductive columns 1102 and dried. After this processing step, spacers 1106 (FIG. 11D) are sprayed over the entire area of the back panel 1100. Front panel processing is similar. An incoming front panel (conductive film) 1200 (FIG. 12A) is laser etched to create conductive rows 1202 (FIG. 12B). Next, polyimide 1204 (FIG. 12C) is printed over the conductive rows 1202 and dried. After this processing step, a seal ring 1206 (FIG. 12D) is printed around the conductive rows 1202 as shown. Referring to FIG. 13A, the mated and sealed panels 1100, 1200 are filled with LC to form an LCD cell structure 1300. After the mated panels 1100, 1200 are filled with LC, an end seal epoxy 1302 (FIG. 13B) is applied to the opening in the seal ring 1206 and cured. Additional processing steps include printing black on the back of the panel 1100, 1200, assembling to driver and electronics, etc. In an alternative embodiment, the back panel 1100 is provided with conductive rows and the front panel 1200 is provided with conductive columns. In an alternative embodiment, the back panel 1100 is provided with a seal ring and the front panel 1200 is provided with spacers. Of course, electrode patterns other than those illustrated can also be provided.

Figure 14:
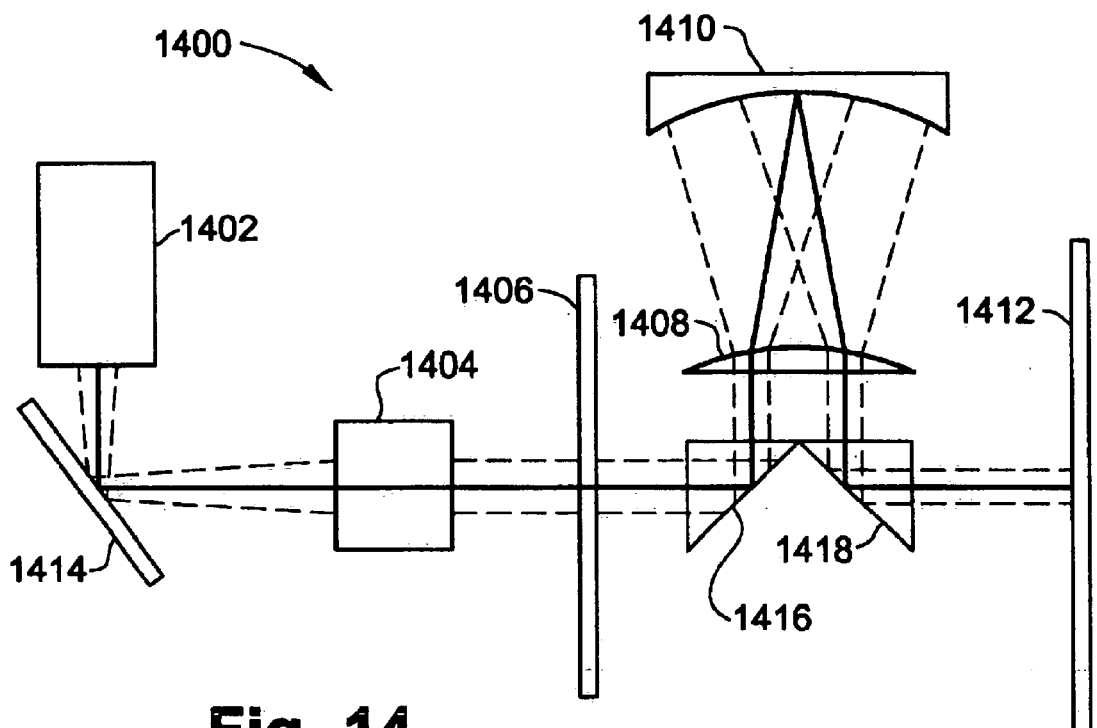
FIG. 14 is a schematic of an exemplary preferred ablation system according to the present invention.

FIG. 14 is a schematic of an ablation system 1400. An exemplary preferred ablation system 1400 comprises an excimer laser projection system which provides high-speed, high-precision etching of conductor/substrate structures with plastic substrates, in an etching process suitable for roll-to-roll production. The illustrated ablation system 1400 comprises an excimer laser 1402, collimating optics 1404, mask 1406, refractive element 1408, reflective element 1410, substrate stage 1412 and mirrors 1414, 1416, 1418 configured as shown. By way of example, the ablation system 1400 is similar to a Tamarack Scientific Co. Inc. (Corona, Calif.) Series 300 "Projection UV Exposure System" with the UV lamp replaced by a XeCl excimer laser (308 nm). The collimating optics 1404 parallel the beam reflected by the mirror 1414. The mask 1406, by way of example, comprises a dielectric material, aluminum, chrome or quartz. For high fluences (above about 400 mJ/cm$^2$) a dielectric mask can be used. For fluences in the midlevel range of 40 to 400 mJ/cm$^2$, an aluminum mask (minimum line gap 5 $\mu$m) can be used. For lower fluences (e.g., <35 mJ/cm$^2$), a chrome mask can be used. In a preferred embodiment, the mask 1406 is positioned over but does not touch the film being ablated. An exemplary preferred ablation system 1400 employs a Dyson-type lens and a vertically oriented substrate stage 1412.

The ablation system 1400 is configured such that the mask 1406 is entirely or partially exposed to a broadened laser beam, which is then sent to the film surface. The complete pattern is therefore ablated on the ITO very quickly (e.g., at 200 Hz, the time needed to ablate a complete pattern was ~1 second) in comparison with the non-masked direct laser beam of prior systems—for which it is critical to precisely control the depth of focus and spot size of the laser, across the substrate, as well as the ablation speed. Depending upon the specific process, it may be necessary to employ a forced gas (e.g., nitrogen purge) and vacuum system when ablating and a water-plasma treatment thereafter in order to remove unwanted particles.

According to an exemplary preferred method of the present invention, the expanded beam of an excimer laser is projected through a (pre-patterned) mask onto the film conductive layer. The excimer laser 1402 is preferably controlled in consideration of the material from which the mask 1408 is fabricated. The laser control parameters may also need to be adjusted depending upon the nature of the pattern being etched.

The typical plastic substrate, as compared to glass, has a surface topology with point-to-point variations both on a local scale and over a larger area. Surface variations on the order of several $\mu$m are common. Layers formed over the plastic substrate (e.g by sputtering or deposition processes) likewise may have a wavy surface or other surface variation. Control of the ablation process according to the present invention can, but does not necessarily, take into account these surface variations. Generally, the UV irradiation process is controlled to avoid ablating the plastic substrate and to leave a protective layer which is sufficiently thick to perform its protective function. Thus, in a preferred embodiment, the depth of focus of the laser is selected/controlled to be sufficiently large to take into account the above-described surface variabilities.

In another preferred embodiment, feedback is employed to adjust the laser control parameters (e.g., laser power at the surface, pulse width, etc.) to compensate for the above-described surface variations. An optical sensor, CCD camera, etc. can be employed to provide a control input. Spectroscopy (e.g., elipsometry) can be employed to provide optical characterizations of the film which reveal changes in its composition.

Figure 15:
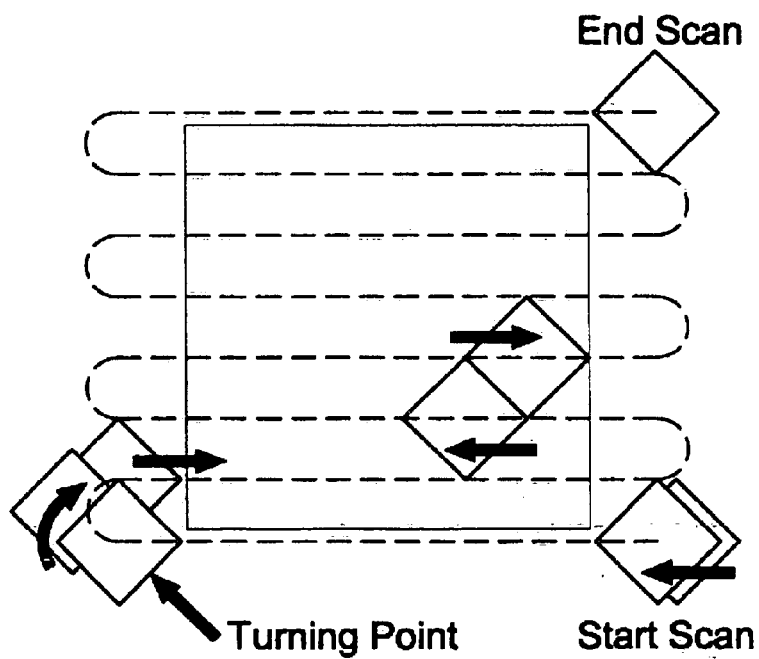
FIG. 15 conceptually illustrates a serpentine scan pattern for an alternative ablation system.

An alternative ablation system is configured to scan in a serpentine pattern with controlled velocity on a first axis and precision stepping on a second axis perpendicular to the first axis. This is conceptually illustrated in FIG. 15 where exposure uniformity is achieved over the entire exposure area by scanning with a diamond-shaped homogenized beam, overlapping adjacent scans by 50%, and precisely controlling the scan velocity.

Although the present invention has been described in terms of the preferred embodiment above, numerous modifications and/or additions to the above-described preferred embodiment would be readily apparent to one skilled in the art. It is intended that the scope of the present invention extends to all such modifications and/or additions.

We claim:

1. A method for patterning a multilayered conductor/substrate structure comprising the steps of:
    providing a multilayered conductor/substrate structure which includes a plastic substrate and at least one conductive layer overlying the plastic substrate; and
    irradiating the multilayered conductor/substrate structure with ultraviolet radiation such that portions of the at least one conductive layer are ablated therefrom;
    wherein the irradiating step comprises employing an excimer laser of a projection-type ablation system to ablate portions of the at least one conductive layer by illuminating a mask with a collimated laser beam and employing projection optics positioned between the mask and the at least one conductive layer to project a pattern from the mask onto the at least one conductive layer.

2. The method for patterning a multilayered conductor/substrate structure of claim 1 wherein the ultraviolet radiation is spatially incoherent.

3. The method for patterning a multilayered conductor/substrate structure of claim 1 wherein the ultraviolet radiation has a wavelength in the mid-UV range.

4. The method for patterning a multilayered conductor/substrate structure of claim 1 wherein the step of employing the excimer laser comprises selecting the excimer laser depending upon radiation absorption of the at least one conductive layer at particular wavelengths.

5. The method for patterning a multilayered conductor/substrate structure of claim 1 wherein the pattern includes a line gap 10 $\mu$m or smaller.

6. The method for patterning a multilayered conductor/substrate structure of claim 1 wherein the steps of providing and irradiating the multilayered conductor/substrate structure are part of a roll-to-roll production process.

7. The method for patterning a multilayered conductor/substrate structure of claim 1 wherein the plastic substrate comprises, polyethylenenapthalate (PEN), or polyethersulphofle (PES).

8. The method for patterning a multilayered conductor/substrate structure of claim 1 wherein the plastic substrate comprises a polyolefin material.

9. The method for patterning a multilayered conductor/substrate structure of claim 1 wherein the at least one conductive layer comprises an oxide layer.

10. The method for patterning a multilayered conductor/substrate structure of claim 1 wherein the at least one conductive layer comprises a metal-based layer.

11. The method for patterning a multilayered conductor/substrate structure of claim 1 wherein the at least one conductive layer comprises a silver-based layer.

12. The method for patterning a multilayered conductor/substrate structure of claim 1 wherein the at least one conductive layer comprises silver and gold.

13. The method for patterning a multilayered conductor/substrate structure of claim 1 wherein the at least one conductive layer is a multilayered conductive film.

14. The method for patterning a multilayered conductor/substrate structure of claim 1 wherein the at least one conductive layer, where it has not been etched, has a thickness between around 10 nm and around 120 nm.

15. The method for patterning a multilayered conductor/substrate structure of claim 1 wherein the at least one conductive layer has a resistivity of no greater than 80 $\Omega$/square.

16. The method for patterning a multilayered conductor/substrate structure of claim 1 wherein the at least one conductive layer has a transmissivity of at least 80%.

17. The method for patterning a multilayered conductor/substrate structure of claim 1 wherein the at least one conductive layer comprises an indium tin oxide (ITO) layer.

18. The method for patterning a multilayered conductor/substrate structure of claim 17 wherein the ITO layer is polycrystalline.

19. The method for patterning a multilayered conductor/substrate structure of claim 1 wherein the at least one conductive layer comprises an alloy.

20. The method for patterning a multilayered conductor/substrate structure of claim 19 wherein the alloy is an indium tin oxide (ITO) alloy.

21. The method for patterning a multilayered conductor/substrate structure of claim 1 wherein the excimer laser is selected to emit light at a discrete characteristic wavelength.

22. The method for patterning a multilayered conductor/substrate structure of claim 21 wherein the characteristic wavelength is 308 nm.

23. The method for patterning a multilayered conductor/substrate structure of claim 21 wherein the characteristic wavelength is 248 nm.

24. The method for patterning a multilayered conductor/substrate structure of claim 1 wherein the multilayered conductor/substrate structure further comprises at least one functional layer intermediate the at least one conductive layer and the plastic substrate, the at least one functional layer comprising an insulating material.

25. The method for patterning a multilayered conductor/substrate structure of claim 24 wherein the irradiating step comprises employing and controlling an excimer laser to ablate portions of the at least one conductive layer without completely decomposing the at least one functional layer therebeneath.

26. The method for patterning a multilayered conductor/substrate structure of claim 24 wherein the at least one functional layer comprises a layer of actylic which abuts the at least one conductive layer.

27. The method for patterning a multilayered conductor/substrate structure of claim 24, further comprising:
an additional functional layer abutting a side of the plastic substrate that faces away from the at least one conductive layer, the additional functional layer serving to provide structural protection and/or environmental protection for the plastic substrate.

28. The method for patterning a multilayered conductor/substrate structure of claim 24 wherein the irradiating step comprises employing and controlling the excimer laser to irradiate a portion of the at least one conductive layer such that a portion of the at least one functional layer therebeneath heats via thermal conduction through the at least one conductive layer and swells to assist in ablating the portion of the at least one conductive layer.

29. The method for patterning a multilayered conductor/substrate structure of claim 28 wherein the step of controlling the excimer laser comprises controlling a fluence.

30. The method for patterning a multilayered conductor/substrate structure of claim 24 wherein the at least one functional layer comprises a protective layer which serves to protect layers beneath the protective layer from laser irradiation.

31. The method for patterning a multilayered conductor/substrate structure of claim 30 wherein the layers beneath comprise a barrier layer which serves to protect the plastic substrate from environmental damage.

32. The method for patterning a multilayered conductor/substrate structure of claim 30 wherein the layers beneath include the plastic substrate.

33. The method for patterning a multilayered conductor/substrate structure of claim 24 wherein the at least one functional layer ocmprises a barrier layer which serves to protect the plastic substrate from enviornmental damage.

34. The method for patterning a multilayered conductor/substrate structure of claim 33 wherein the barrier layer is inorganic.

35. The method for patterning a multilayered conductor/substrate structure of claim 33 wherein the barrier layer has an oxygen transmission rate (OTR) no greater than 0.05 $cc/m^2/day$.

36. The method for patterning a multilayered conductor/substrate structure of claim 33 wherein the barrier layer has a water vapor transmission rate (WVTR) no greater than 0.05 $g/m^2/day$.

37. The method for patterning a multilayered conductor/substrate structure of claim 24, further comprising:
an additional functional layer abutting a side of the plastic substrate that faces away from the at least one conductive layer, the additional functional layer serving to provide structural protection and/or environmental protection for the plastic substrate.

* * * * *